(12) United States Patent
Sugahara (10) Patent No.: US 9,093,837 B2
(45) Date of Patent: Jul. 28, 2015

(54) ABNORMAL VOLTAGE DETECTING DEVICE

(71) Applicant: FUJI ELECTRIC CO., LTD., Kawasaki-shi (JP)

(72) Inventor: Satoshi Sugahara, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 184 days.

(21) Appl. No.: 13/895,298

(22) Filed: May 15, 2013

(65) Prior Publication Data

US 2013/0342947 A1    Dec. 26, 2013

(30) Foreign Application Priority Data

Jun. 20, 2012   (JP) ................................ 2012-139238

(51) Int. Cl.
| | |
|---|---|
| H02H 3/00 | (2006.01) |
| H02H 3/24 | (2006.01) |
| G01R 19/165 | (2006.01) |
| H02H 3/10 | (2006.01) |
| H02H 3/20 | (2006.01) |
| H02J 1/06 | (2006.01) |
| G01R 19/00 | (2006.01) |

(52) U.S. Cl.
CPC ........... *H02H 3/24* (2013.01); *G01R 19/16576* (2013.01); *G01R 19/0084* (2013.01); *H02H 3/105* (2013.01); *H02H 3/207* (2013.01); *H02J 1/06* (2013.01)

(58) Field of Classification Search
USPC .............................. 361/91.1, 91.3, 92, 86–87
See application file for complete search history.

(56) References Cited

U.S. PATENT DOCUMENTS

| | | | |
|---|---|---|---|
| 6,574,081 B1 | 6/2003 | Matsumoto et al. | |
| 2002/0181179 A1* | 12/2002 | Balakrishnan et al. | ......... 361/87 |
| 2011/0069420 A1* | 3/2011 | Chiu et al. | ................... 361/91.1 |
| 2012/0194955 A1* | 8/2012 | Billingsley et al. | .......... 361/91.1 |

FOREIGN PATENT DOCUMENTS

| | | |
|---|---|---|
| JP | H06-002989U A | 1/1994 |
| JP | 2001-161062 A | 6/2001 |

* cited by examiner

*Primary Examiner* — Danny Nguyen
(74) *Attorney, Agent, or Firm* — Rabin & Berdo, P.C.

(57) ABSTRACT

An abnormal voltage detecting device monitors abnormal decrease in monitoring voltage during a start up period of a voltage generating apparatus. The abnormal voltage detecting device comprises a level shift circuit that generates a reference voltage for a start up period by reducing, in a predetermined amount, voltage from a reference voltage for soft starting, and further comprises a three input comparator that receives a monitoring voltage, a reference voltage Vref, and the reference voltage for the start up period, and that reverses a logical output when the monitoring voltage is lower than the reference voltage Vref and the reference voltage for the start up period. An abnormality detecting signal is delivered when the logical output of the three input comparator is reversed, and operation of an output circuit is inhibited until the reference voltage for the start up period exceeds a predetermined start up determining voltage.

13 Claims, 5 Drawing Sheets

ABNORMAL VOLTAGE DETECTING DEVICE

CROSS-REFERENCE TO RELATED APPLICATION

This application is based on, and claims priority to, Japanese Patent Application No. 2012-139238, filed on Jun. 20, 2012, contents of which are incorporated herein by reference.

BACKGROUND OF THE INVENTION

1. Field of the Invention

The present invention relates to voltage monitoring technology for detecting decrease in the monitoring voltage and operating a protection circuit, and in particular, to an abnormal voltage detecting device capable of avoiding erroneous detection in a start up period of a voltage generating apparatus.

2. Description of the Related Art

Voltage generating apparatuses, typically power supply circuits and reference voltage generating circuits, are provided with a low voltage protection circuit for interrupting voltage output from the voltage generating apparatus when the output voltage has decreased below a predetermined lower limit voltage, as described in Patent Documents 1 and 2 (identified below). This low voltage protection circuit is provided in order to prevent a load circuit that operates while receiving the output voltage of the voltage generating apparatus from malfunctioning due to the decrease in the output voltage.

Figure 4:
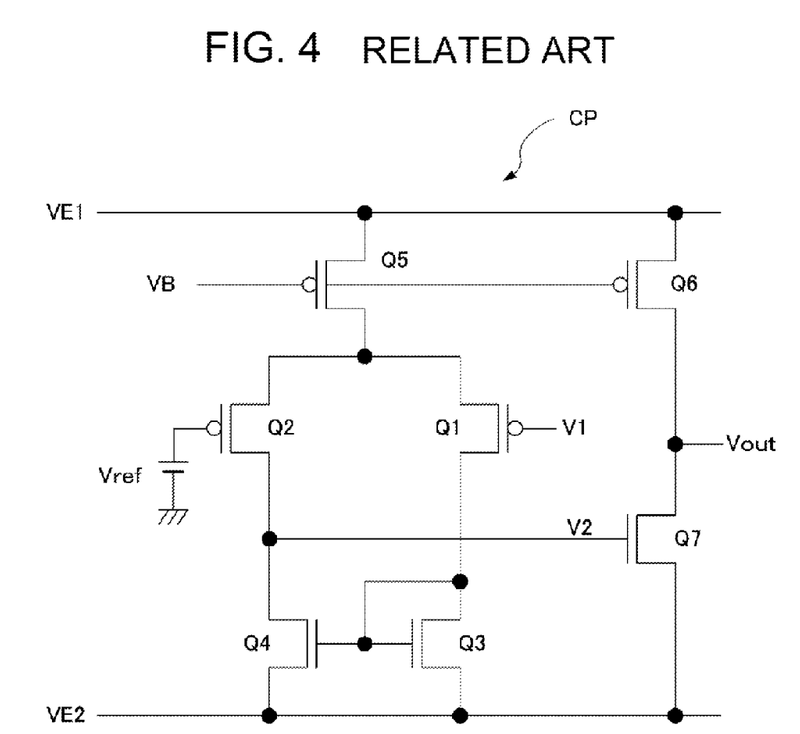
FIG. 4 shows an example of construction of a comparator used in a conventional common abnormal voltage detection device.

The abnormal decrease in the output voltage can be detected, for example, using a comparator CP having a construction shown in FIG. 4, which compares a monitoring voltage V1 corresponding to the output voltage with a reference voltage Vref that specifies the lower limit of the monitoring voltage V1. The monitoring voltage V1 can be obtained by resistance division of the output voltage and thus, is proportional to the output voltage. The comparator CP reverses the logical output thereof and delivers an abnormality detection signal Vout when the monitoring voltage V1 has lowered below the reference voltage Vref (V1<Vref), operating the low voltage protection circuit to interrupt the voltage output from the voltage generating apparatus.

The comparator CP of FIG. 4 comprises: a differential amplifier composed of a pair of transistors Q1 and Q2 with their loads of a pair of transistors Q3 and Q4 forming a current mirror circuit and driven by a first constant current source composed of a transistor Q5 coupled to a voltage VB; and a transistor Q7 that is driven by a second constant current source composed of a transistor Q6 and generates an abnormality detecting signal Vout based on receiving an output V2 of the differential amplifier.

However, the rise up of the monitoring voltage V1 of the voltage generating apparatus is not very fast in the startup period of the apparatus. As a result, the comparator CP may deliver an abnormality detection signal Vout, which would operate the low voltage protection circuit to stop voltage output of the voltage generating apparatus. As a consequence, the start up itself of the voltage generating apparatus may be disturbed.

To cope with this problem in a known low voltage protection circuit, the starting up situation is detected in the start up of the voltage generating apparatus using a reference voltage Vss for soft starting which can be a ramp voltage gradually increasing from the ground potential at zero volts. Based on the detection, reception of the abnormality detection signal Vout is inhibited until completion of the start up process of the voltage generating apparatus. After the completion of the start up process of the voltage generating apparatus is detected using the reference voltage Vss for soft starting in a monitoring device for monitoring abnormal decrease in the monitoring voltage V1, the output of the abnormality detection signal Vout is permitted for the low voltage protection circuit.

Figure 5:
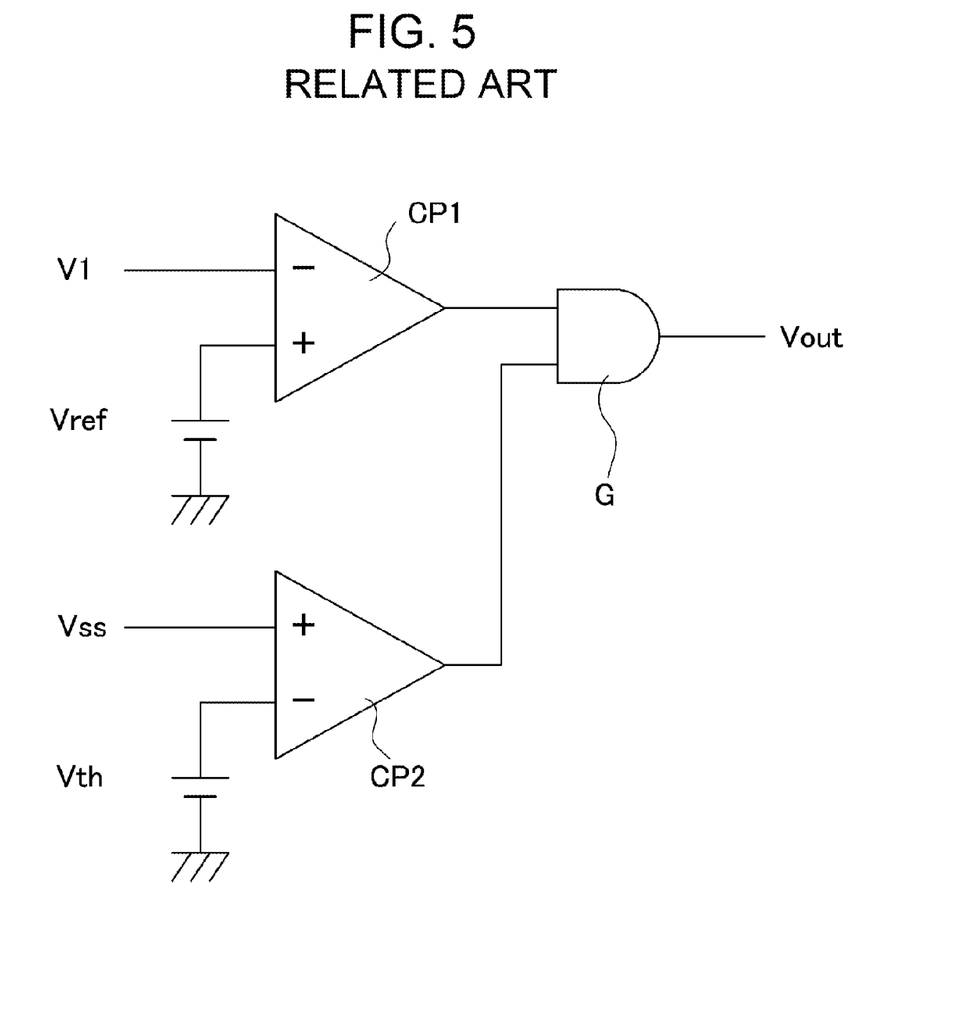
FIG. 5 shows a conventional example of circuit for avoiding erroneous detection in a start up period of a voltage generating apparatus.

Specifically as shown in FIG. 5, in addition to a first comparator CP1 for comparing the monitoring voltage V1 with a reference voltage Vref, a second comparator CP2 is used for comparing the reference voltage Vss for soft starting with a start up determining voltage Vth for detecting completion of start up process of the voltage generating apparatus. The second comparator CP2 detects the completion of start up of the voltage generating apparatus and then, the gate circuit G is made active to permit the first comparator CP1 to deliver the abnormality detection signal Vout.

[Patent Document 1]
Japanese Unexamined Patent Application Publication No. 2001-161062

[Patent Document 2]
Japanese Utility Model Application Publication No. H06-002989

However, in order to detect abnormal decrease in the output voltage while monitoring start of the voltage generating apparatus using the reference voltage Vss for soft starting, an abnormal voltage detecting circuit of the voltage generating apparatus needs the two comparators CP1 and CP2 as described above and thus results in a complicated construction. In addition, since the above-described conventional construction renders the monitoring of the abnormal decrease in the output voltage inactive in the start up period of the voltage generating apparatus, it is impossible to know whether the voltage generating apparatus is working normally or not, which is another problem in the conventional technology.

SUMMARY OF THE INVENTION

The present invention has been accomplished in view of the situation described above and an object of the invention is to provide an abnormal voltage detecting device with a simple construction that avoids erroneous detection of abnormal voltage decrease in the start up period of a voltage generating apparatus while monitoring the abnormal decrease in the output voltage of the voltage generating apparatus in the start up period of the apparatus.

In order to achieve the above object, an abnormal voltage detecting device of the present invention comprises a level shift circuit that generates a reference voltage Vss1 for a start up period by reducing, in a predetermined amount, voltage from a reference voltage Vss for soft starting that gradually increases from a ground potential on start of operation of a voltage generating apparatus. The abnormal voltage detecting device further comprises a three input comparator that has three input terminals: a first input terminal that receives monitoring voltage V1 for monitoring output voltage of the voltage generating apparatus, a second input terminal that receives a reference voltage Vref specifying a lower limit of the monitoring voltage V1, and a third input terminal that receives the reference voltage Vss1 for a start up period. The three input comparator reverses a logical output when the monitoring voltage V1 is lower than the reference voltage Vref and when the monitoring voltage V1 is lower than the reference voltage Vss1 for a start up period.

The abnormal voltage detecting device further comprises an output circuit that delivers an abnormality detecting signal Vout when the logical output from the three input comparator is reversed, and a switching circuit that inhibits operation of the output circuit until the reference voltage Vss1 for a start up period exceeds a predetermined start up determining voltage Vth.

The reference voltage Vss for soft starting is a reference voltage used in the start up period of the voltage generating apparatus and for example, a ramp voltage signal gradually rising from a basic potential, for example, zero volts. The level shift circuit reduces the reference voltage Vss for soft starting by a predetermined amount of voltage to generate a reference voltage Vss1 for a start up period. The output circuit gives the abnormality detection signal Vout to a low voltage protection circuit of the voltage generating apparatus to interrupt the voltage output from the voltage generating apparatus.

The three input comparator may comprise: a differential amplifier composed of first and second transistors that have a load of a current mirror circuit and are MOS-FETs, for example, a first constant current source to drive the differential amplifier, and a third transistor that is connected in parallel to the second transistor and is a MOS-FET, for example. The three input comparator receives the monitoring voltage V1 into the first transistor, the reference voltage Vref specifying the lower limit of the monitoring voltage V1 into the second transistor, and the reference voltage Vss1 for a start up period into the third transistor to perform a comparing and reversing operation.

The output circuit may comprise a fourth transistor, which can be a MOS-FET, that is driven by a second constant current source and performs an ON/OFF operation in response to receiving a logical output of the three input comparator. The switching circuit may comprise a first switching element that is driven by a third constant current source and performs an ON operation when the reference voltage Vss1 for a start up period exceeds the start up determining voltage Vth, a second switching element that connects the fourth transistor to the second constant current source based on a turning ON operation of the first switching element, and a third switching element that performs a short-circuiting of the fourth transistor based on a turning OFF operation of the first switching element.

The first, second, and third switching elements may each comprise a MOS-FET, and the start up determining voltage Vth may be a gate-source voltage Vgs to determine a gate threshold voltage of the MOS-FET.

An abnormal voltage detecting device having the construction described above uses the reference voltage Vss1 for a start up period that is obtained by reducing the reference voltage Vss for soft starting by a predetermined amount of voltage by the level shift circuit. Operation of the output circuit is inhibited solely during an initial start up period until this reference voltage Vss1 for a start up period exceeds the start up determining voltage Vth. Thus, monitoring of abnormal decrease in the output voltage is interrupted only in the initial start up period in which the output voltage is most unstable in the start up period of the voltage generating circuit.

After the initial start up period, the monitoring voltage V1 is monitored for abnormal decrease using the reference voltage Vss1 for a start up period as a threshold value for abnormality determination. Then, after the reference voltage Vss1 for a start up period reaches the reference voltage Vref, in other words, after the monitoring voltage V1 has risen to a sufficiently high voltage, the monitoring voltage V1 is monitored for abnormal decrease thereof using the reference voltage Vref as a threshold value for abnormality determination.

Therefore, on starting up a voltage generating apparatus, the voltage generating apparatus is allowed to be monitored for abnormal decrease in an output voltage of the apparatus only excepting the initial start up period in the start up procedure. The monitoring for abnormal decrease of the monitoring voltage V1 in the invention is conducted using the reference voltage Vss1 for a start up period that is obtained by reducing, in a predetermined amount, voltage from the reference voltage Vss for soft starting as a threshold value for determining an abnormality. Therefore, any erroneous detection of abnormal decrease in the output voltage is more effectively avoided in the procedure of start up of a voltage generating apparatus as compared with a monitoring method that uses, for example, the reference voltage Vss for soft starting as a threshold value for determining abnormality.

The abnormal voltage detection device utilizes the three input comparator effectively to compare the monitoring voltage V1 with the reference voltage Vref, and the reference voltage Vss1 for a start up period. The reference voltage Vss1 for a start up period is simultaneously utilized for controlling inhibition of operation of the output circuit. As a consequence, the circuit construction is substantially simplified as compared with the conventional construction comprising two comparators for separately detecting and determining abnormality of the monitoring voltage V1 and the reference voltage Vss for soft starting, and additional gate circuitry for output control of the abnormality detecting signal Vout. The simplified construction can be readily produced in an integrated circuit structure.

DETAILED DESCRIPTION OF THE INVENTION

The following describes an abnormal voltage detecting device according to an embodiment of the present invention with reference to the accompanying drawings.

This abnormal voltage detecting device monitors a monitoring voltage V1 detected by, for example, resistor-dividing the output voltage generated by a voltage generating apparatus (not shown in the figure). Upon detecting abnormal decrease in the monitoring voltage V1, the abnormal voltage detecting device delivers an abnormality detecting signal Vout to operate a low voltage protection circuit (not shown in the figure) of the voltage generating apparatus thereby interrupting voltage delivery of the voltage generating apparatus.

Figure 1:
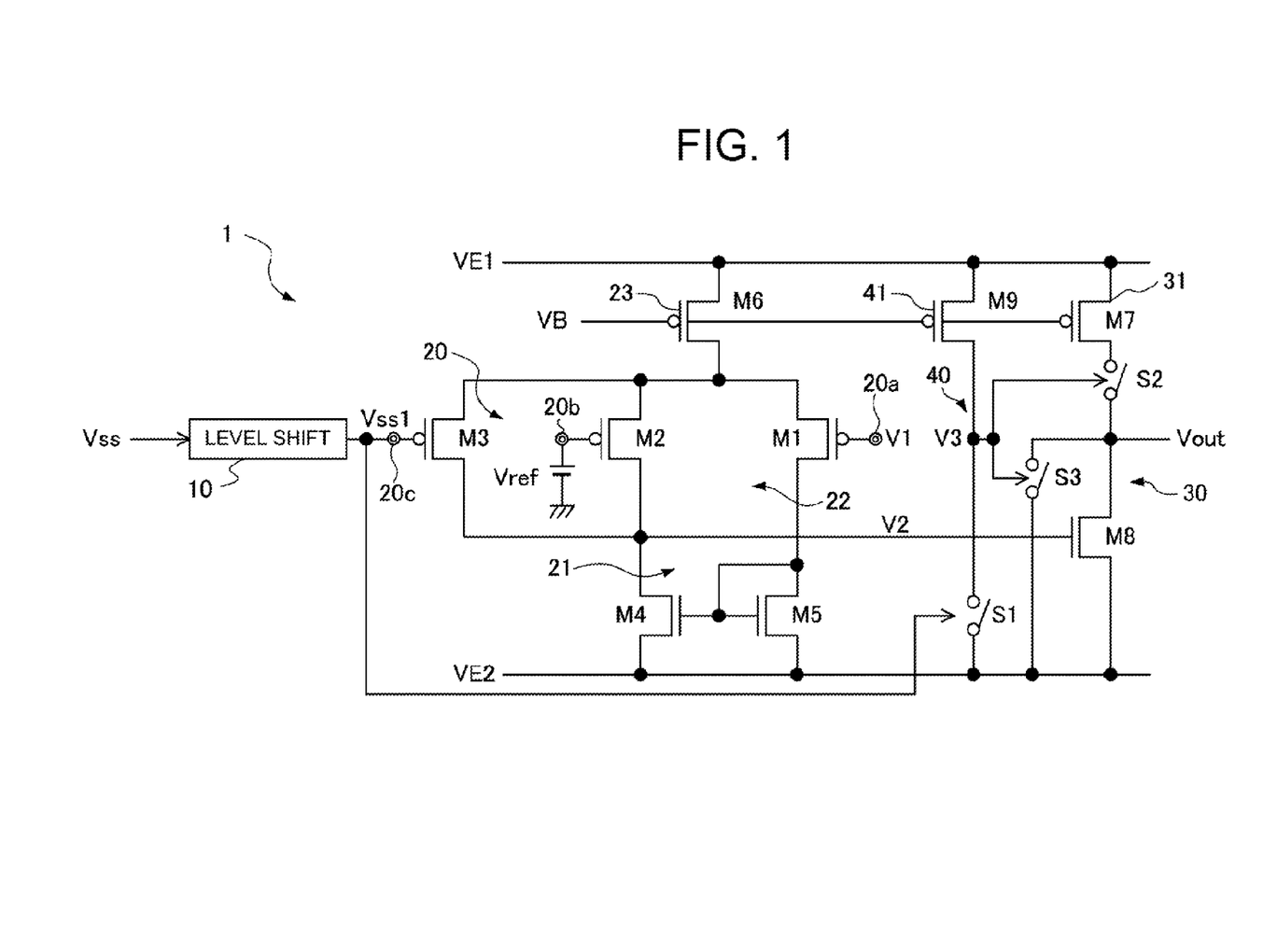
FIG. 1 shows a schematic construction of an abnormal voltage detecting device according to an embodiment of the present invention.

FIG. 1 shows a schematic construction of an abnormal voltage detecting device according to an embodiment of the present invention. A level shift circuit 10 generates a reference voltage Vss1 for a start up period by level-shifting, or reducing, by a predetermined amount of voltage, a reference voltage Vss for soft starting, which is generated by the voltage generating apparatus simultaneously with start up thereof, or provided by an external means at the start up of the voltage generating apparatus. This reference voltage Vss for soft starting is, for example, a ramp voltage signal that starts to rise gradually from a basic voltage of ground potential at zero volts at the start up moment of the voltage generating apparatus. A positive side power supply voltage and a negative side power supply voltage that is at zero volts are indicated with reference symbols VE1 and VE2, respectively.

The three input comparator 20 has three input terminals: a first input terminal 20a for receiving the monitoring voltage V1, a second input terminal 20b for receiving the reference voltage Vref that specifies the lower limit of the monitoring voltage V1, and a third input terminal 20c for receiving the reference voltage Vss1 for a start up period, which is given by the level shift circuit 10. The three input comparator 20 compares the monitoring voltage V1 with the reference voltage Vref and with the reference voltage Vss1 for a start up period, and reverses the logical output according to the comparison result.

More specifically, the three input comparator 20 comprises: a differential amplifier 22 composed of a first transistor M1 and the second transistor M2 that have a load of a transistor M5 and a load of a transistor M4, respectively, the transistors M4 and M5 forming a current mirror circuit 21; a first constant current source 23 coupled to a voltage VB, which is composed of a transistor M6, for driving the differential amplifier 22; and a third transistor M3 connected in parallel to the second transistor M2. The transistors M1, M2, M3, and M6 are p-type MOS-FETs and the transistors M4 and M5 are n-type MOS-FETs, for example.

In the three input comparator 20, the first input terminal 20a receiving the monitoring voltage V1 connects to the gate of the first transistor M1, the second input terminal 20b receiving the reference voltage Vref connects to the gate of the second transistor M2, and the third input terminal 20c receiving the reference voltage Vss1 for a start up period connects to the gate of the third transistor M3. The three input comparator 20 compares the monitoring voltage V1 and the reference voltage Vref by the transistors M1 and M2, and at the same time, compares the monitoring voltage V1 and the reference voltage Vss1 for a start up period by the transistors M1 and M3.

The second and third transistors M2 and M3 are connected in parallel with each other and have a common load of the transistor M4. Consequently, a transistor out of the two transistors M2 and M3 that works in preference is the transistor that receives a lower voltage of the reference voltage Vref and the reference voltage Vss1 for a start up period. The voltage at that transistor M2 or M3 is compared with the monitoring voltage V1 given to the first transistor M1. Thus, in the case the reference voltage Vss1 for a start up period is lower than the reference voltage Vref, voltage comparison is executed between the first transistor M1 and the third transistor M3, and the logical output is reversed when the monitoring voltage V1 is lower than the reference voltage Vss1 for a start up period. In the case the reference voltage Vss1 for a start up period is higher than the reference voltage Vref, voltage comparison is executed between the first transistor M1 and the second transistor M2, and the logical output is reversed when the monitoring voltage V1 is lower than the reference voltage Vref.

The output circuit 30, which delivers the abnormality detecting signal Vout based on receiving a logical output from the three input comparator 20, is driven by the second constant current source 31 comprising a transistor M7, and comprises an output transistor M8 that performs ON/OFF operation based on receiving a logical output voltage at the drain terminal of the transistor M4 in the three input comparator 20. Here, the transistor M7 is a p-type MOS-FET and the output transistor M8 is an n-type MOS-FET. The transistor M8 normally performs an ON operation to hold the output in the "L" state, and when the monitoring voltage V1 becomes lower than the reference voltage Vref and the reference voltage Vss1 for a start up period, the transistor M8 performs an OFF operation to turn the output to an "H" state and delivers the abnormality detecting signal Vout.

The switching circuit 40 inhibits operation of the output circuit 30 in the initial start up period until the reference voltage Vss1 for a start up period exceeds the predetermined start up determining voltage Vth in the start up period of the voltage generating circuit. The switching circuit 40 is provided with a first switch S1 that performs an ON/OFF operation based on receiving the reference voltage Vss1 for a start up period. This first switch S1 comprises a MOS-FET that is driven by the third constant current source 41 comprising a transistor M9 as described later.

The switching circuit 40 further comprises a second switch S2 and a third switch S3. The second switch S2 is inserted in series between the second constant current source 31 comprising a transistor M7 and the output transistor M8. The third switch S3 is connected in parallel to the output transistor M8 and operates complimentarily with the second switch S2. Both the second and the third switches S2 and S3 also comprise MOS-FETs as described later.

The second switch S2 performs an OFF operation when the first switch S1 is in an OFF state to separate the output transistor M8 from the second constant current source 31, and makes the second constant current source 31 drive the output transistor M8 only when the first switch S1 performs an ON operation. The third switch S3 performs an ON operation when the first switch S1 is in an OFF state to short-circuit the output transistor M8 and forces the output of the output transistor M8 at the "L" level. When the first switch S1 is in an ON operation, the third switch S3 performs an OFF operation to allow the output transistor M8 to be driven.

Figure 2A:
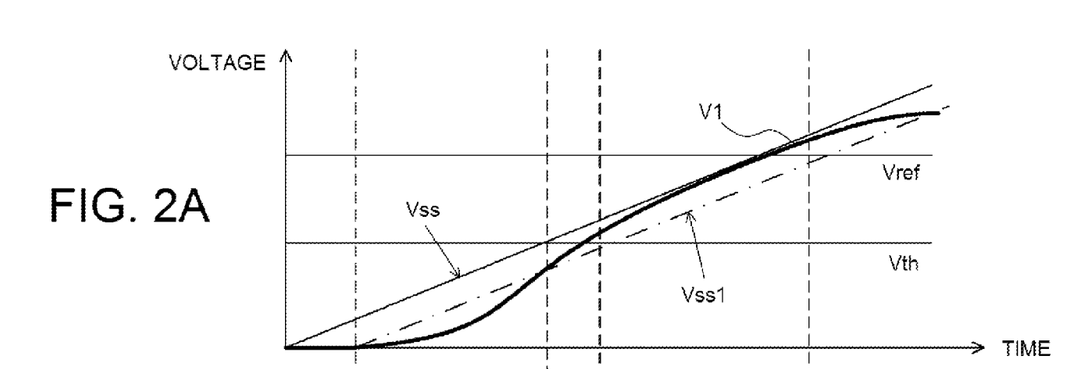
FIGS. 2A through 2D are operational timing charts illustrating operation of the device of the embodiment example with variation of monitoring voltage V1 during a start up period of a voltage generating apparatus.

The abnormal voltage detecting device 1 having the construction described above receives the reference voltage Vss for soft starting at the start of operation of the voltage generating apparatus as shown in FIGS. 2A through 2D, which shows operation timing with variation of the monitoring voltage V1 in the start up period of the voltage generating apparatus. The three input comparator 20 receives the reference voltage Vss1 for a start up period that is level-shifted downward by the level shift circuit 10 from the reference voltage Vss for soft starting. The reference voltage Vss1 for a start up period is, as shown in FIG. 2A, much lower than the reference voltage Vref in the initial stage of start up period of the voltage generating apparatus and gradually rises with time.

Figure 2B:
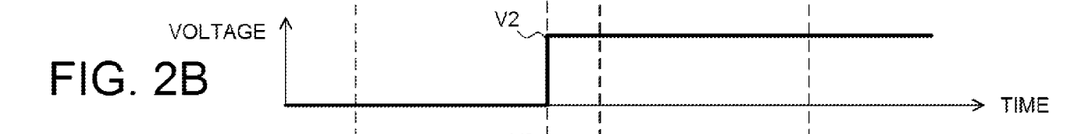

In this initial stage of start up period of the voltage generating apparatus in which the reference voltage Vss1 for a start up period is lower than the reference voltage Vref (Vss1<Vref), the three input comparator 20 compares the monitoring voltage V1 with the reference voltage Vss1 for a start up period as described previously. If the monitoring voltage V1 is lower than the reference voltage Vss1 for a start up period (V1<Vss1), the three input comparator 20 delivers a logical output of "L" as shown in FIG. 2B indicating an abnormally low state of the monitoring voltage V1. At the moment t2 when the monitoring voltage V1 exceeds the reference voltage Vss1 for a start up period (V1>Vss1), the three input comparator 20 reverses the logical output thereof to an "H" state (e.g., a voltage V2) indicating escape from the abnormally low state of the monitoring voltage V1.

Figure 2C:
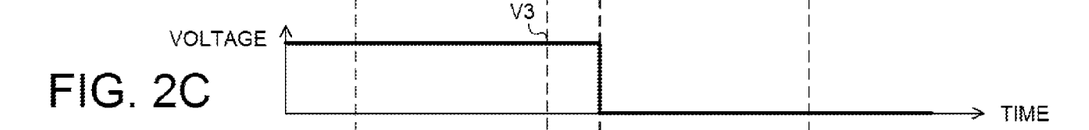
Figure 2D:
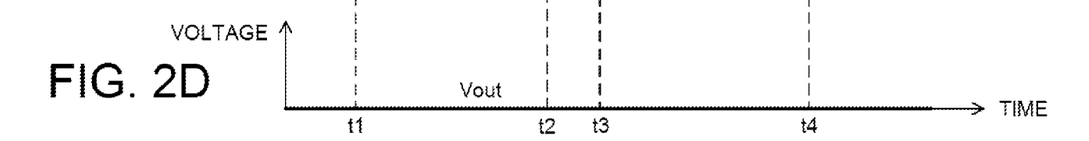

In the initial start up period of the voltage generating apparatus, however, the first switch S1 remains in the OFF state until the reference voltage Vss1 for a start up period exceeds the start up determining voltage Vth of the first switch S1 at the moment t3. In this period, the output voltage V3 of the switch S1, which drives the second and third switches S2 and S3, is held at the "H" level (e.g., voltage V3) as shown in FIG. 2C. As a consequence, operation of the output circuit 30 is inhibited and the output voltage level of the output circuit 30 remains at "L" as shown in FIG. 2D.

Thus, in the initial start up period of the voltage generating apparatus from the start to the time t3, the operation of the output circuit 30 is inhibited and consequently, even if the monitoring voltage V1 is lower than the reference voltage Vss1 for a start up period to make the logical output of the three input comparator 20 in an "L" state as in the period from t1 to t2, the output voltage of the output circuit 30 never becomes "H". In other words, the abnormality detecting signal Vout is never delivered in the initial start up period up to the time t3 in the start up period of the voltage generating apparatus.

After the time t3 in the start up period of the voltage generating apparatus, the output voltage of the voltage generating apparatus rises to a moderately high level and gradually approaches and settles to a specified voltage value according to the specification. At the time t3, the reference voltage Vss1 for a start up period exceeds the start up determining voltage Vth and the first switch S1 turns ON. As a consequence, the output transistor M8 is driven through the second switch S2 and simultaneously, released from the forced short-circuiting through the third switch S3.

Thus, after the time t3, if the monitoring voltage V1 happens to become lower than the reference voltage Vss1 for a start up period due to any reason reversing the logical output of the three input comparator 20 to the "L" level, the output transistor M8 receiving the logical output turns OFF and reverses the voltage at the output terminal of the output circuit 30 to an "H" level delivering the output terminal voltage as an abnormality detecting signal Vout.

When the reference voltage Vss1 for a start up period exceeds the reference voltage Vref at the time t4, the second transistor M2 receiving the reference voltage Vref acts in preference to the third transistor M3. Accordingly, the three input comparator 20 compares the monitoring voltage V1 with the reference voltage Vref. Thus, when the monitoring voltage V1 of the voltage generating apparatus has risen to a level high enough to escape from the start up period, the monitoring voltage V1 is monitored for abnormal voltage decrease in the comparison with the reference voltage Vref that is the primary reference voltage. If the monitoring voltage V1 abnormally decreases due to any reason below the reference voltage Vref, the transistor M8 performs an OFF operation and an abnormality detecting signal Vout is delivered.

Therefore, the abnormal voltage detecting device having the construction and operating as described thus far effectively utilizes the reference voltage Vss for soft starting given at the start of the voltage generating apparatus and inhibits operation of the output circuit 30 only during the initial start up period of the voltage generating apparatus until the reference voltage Vss1 for a start up period level-shifted from the reference voltage Vss for soft starting exceeds the start up determining voltage Vth. After the initial start up period, the monitoring voltage V1 is monitored for any abnormal decrease in the start up period of the voltage generating apparatus using the reference voltage Vss1 for a start up period. After the end of the start up period at the time t4, abnormal decrease of the monitoring voltage V1 can be detected using the reference voltage Vref. Thus, any abnormal decrease in the monitoring voltage V1 can be effectively monitored throughout the period including the start up period of the voltage generating apparatus.

Figure 3:
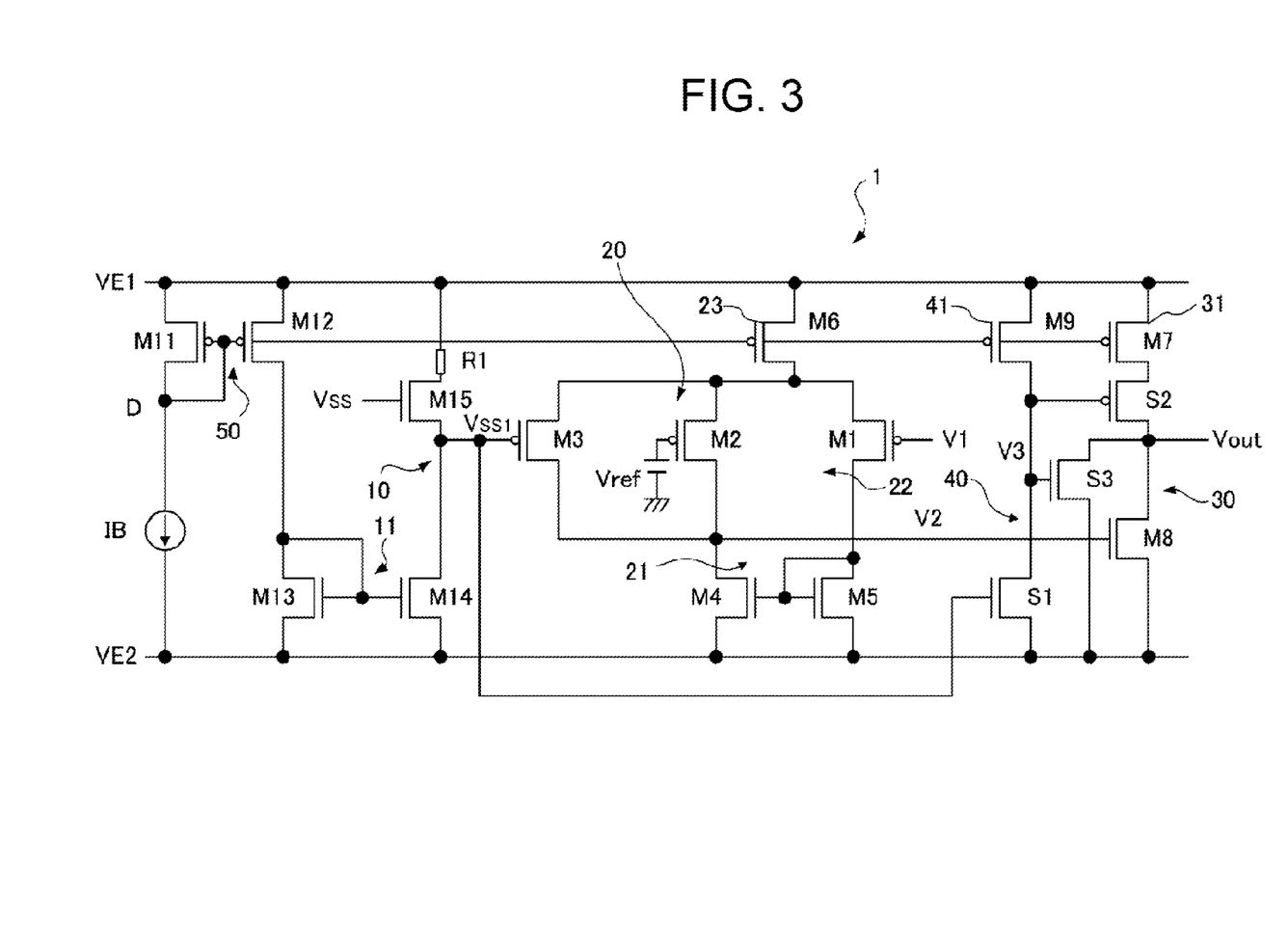
FIG. 3 is a circuit diagram showing a specific construction example of the abnormal voltage detecting device of FIG. 1 produced in an integrated circuit construction.

An abnormal voltage detecting device as described above can be produced in an integrated circuit structure as shown in FIG. 3, for example, composed mainly of MOS-FETs in the whole structure including the level shift circuit 10. In FIG. 3, the similar components as in FIG. 1 are given the same symbol and descriptions thereon are not repeated here.

The abnormal voltage detecting device of FIG. 3 is provided with a basic constant current source IB. A current mirror circuit 50 is formed of a pair of transistors M11 and M12, which are MOS-FETs, and the transistors M6, M7, and M9, the four transistors M12 and M6, M7, and M9 being in linkage with commonly connected gate terminals. The transistor M12 and the transistors M6, M7, and M9, the latter three being the first, second, and third constant current sources 23, 31, and 41, generate current proportional to the one flowing in the basic constant current source IB through the drain terminals of the four transistors. The transistor M12, which functions as a constant current source, is connected to a current mirror circuit 11 that comprises a pair of transistors M13 and M14 and drives the level shift circuit 10.

The level shift circuit 10 comprises a transistor M15, an n-type MOS-FET, forming a source follower circuit connecting the drain terminal thereof to the positive power supply voltage VE1 through a load resistor R1 and the source terminal thereof to the transistor M14 of the current mirror circuit 11. This transistor M15 operates in the saturated region and generates the reference voltage Vss1 for a start up period through level-shifting the reference voltage Vss for soft starting downward by the magnitude of the gate-source voltage Vgs.

The first switch S1, which is actualized using for example, an n-type MOS-FET, examines the reference voltage Vss1 for a start up period employing the gate-source voltage Vgs as a start up determining voltage Vth. When the reference voltage Vss1 for a start up period exceeds the start up determining voltage Vth (Vss1>Vth), the first switch S1 turns ON to reverse the output, which is a drain voltage, into an "L" level. The second switch S2, which is actualized using, for example, a p-type MOS-FET, turns ON when the first switch S1 turns ON; and the third switch S3, which is actualized using, for example, an n-type MOS-FET, turns OFF when the first switch S1 turns ON.

Thus, the abnormal voltage detecting device as shown in FIG. 3 can be readily actualized in an integrated circuit structure by using mainly MOS-FETs in every circuit of the level shift circuit 10, the three input comparator 20, the output circuit 30, and the switching circuit 40. The circuit construction is substantially simplified as compared with the conventional example of construction where two comparators are used for examining separately the monitoring voltage V1 and the reference voltage Vss for soft starting, and a gate circuit is additionally used for controlling delivery of the abnormality detecting signal Vout. Therefore, a substantial advantage is obtained in practical application.

The abnormal voltage detecting device described above generates a reference voltage Vss1 for a start up period that is level-shifted downward from the reference voltage Vss for soft starting given on the start of operation of the voltage generating apparatus. The reference voltage Vss1 for a start up period is used to inhibit delivery of the abnormality detecting signal Vout only during the initial start up period of the voltage generating apparatus. Simultaneously, the reference voltage Vss1 for a start up period is used as a threshold value for determining abnormal decrease of the monitoring voltage V1 in the start up period of the voltage generating device. Thus, in contrast to the conventional device in which merely the reference voltage Vss for soft starting is utilized to determine a start up period of the voltage generating apparatus and for controlling inhibition of delivery of the abnormality detecting signal Vout, the device of the invention effectively monitors abnormal decrease in the monitoring voltage V1 throughout the operation period including the start up period of the voltage generating apparatus.

The present invention is not limited to the embodiments described thus far. For example, the input/output logic in the three input comparator 20 and the output circuit 30 can be changed by exchanging "H" and "L". Specific structure of the level shift circuit 10, the three input comparator 20, the output circuit 30, and the switching circuit 40 can be modified without deviating from the logic of the monitoring condition of the monitoring voltage V1.

In addition, the reducing amount of the voltage from the reference voltage Vss for soft starting in the level shift circuit 10 can be sufficiently determined corresponding to the specifications of the voltage generating apparatus including, in particular, the rising up characteristics. The present invention can be further modified within the spirit and scope of the present invention.

What is claimed is:

1. An abnormal voltage detecting device comprising:
    a level shift circuit that generates a reference voltage for a start up period by reducing, in a predetermined amount, voltage from a reference voltage for soft starting that gradually increases from a ground potential on start of operation of a voltage generating apparatus;
    a three input comparator including
        a first input terminal that receives monitoring voltage proportional to an output voltage of the voltage generating apparatus,
        a second input terminal that receives a reference voltage specifying a lower limit of the output voltage, and
        a third input terminal that receives the reference voltage for a start up period;
    wherein the three input comparator reverses a logical output when the output voltage is lower than the reference voltage specifying the lower limit of the output voltage and when the output voltage is lower than the reference voltage for a start up period;
    an output circuit that delivers an abnormality detecting signal when the logical output from the three input comparator is reversed; and
    a switching circuit that inhibits operation of the output circuit until the reference voltage for a start up period exceeds a predetermined start up determining voltage.

2. The abnormal voltage detecting device according to claim 1, wherein
    the reference voltage for soft starting is a ramp voltage signal gradually increasing from a basic potential on start of operation of the voltage generating apparatus, and
    the output circuit delivers the abnormality detecting signal to a low voltage protection circuit of the voltage generating apparatus.

3. The abnormal voltage detecting device according to claim 1, wherein
    the three input comparator comprises:
        a differential amplifier including first and second transistors that have a load of a current mirror circuit,
        a first constant current source to drive the differential amplifier, and
        a third transistor connected in parallel to the second transistor; and
    the three input comparator receives the monitoring voltage into the first transistor, the reference voltage specifying the lower limit of the output voltage into the second transistor, and the reference voltage for a start up period into the third transistor to perform a comparing and reversing operation.

4. The abnormal voltage detecting device according to claim 3, wherein
    the first, second, and third transistors include MOS-FETs.

5. The abnormal voltage detecting device according to claim 1, wherein
    the output circuit comprises a fourth transistor that is driven by a second constant current source and performs an ON/OFF operation in response to receiving the logical output of the three input comparator; and
    the switching circuit comprises:
        a first switching element that is driven by a third constant current source and performs an ON operation when the reference voltage for a start up period exceeds the start up determining voltage,
        a second switching element that connects the fourth transistor to the second constant current source based on a turning ON operation of the first switching element, and
        a third switching element that performs a short-circuiting of the fourth transistor based on a turning OFF operation of the first switching element.

6. The abnormal voltage detecting device according to claim 5, wherein
    the first, second, and third switching elements include MOS-FETs, and the start up determining voltage is a gate threshold voltage of the MOS-FET.

7. An apparatus, comprising:
    a comparator device configured to perform a comparison of at least one of a first reference voltage or a second reference voltage to a monitoring voltage, and output a comparison signal based on the comparison,
    wherein the first reference voltage indicates a lower limit for the monitoring voltage, and
    the second reference voltage is a reference start-up voltage corresponding to a start-up period of a voltage generator; and
    a detecting device configured to
        inhibit an abnormality signal indicating an abnormal voltage during the start-up period and before the second reference voltage exceeds a threshold value, and
        output an abnormality signal indicating an abnormal voltage after the second reference voltage exceeds the threshold value, based on the comparison signal indicating that the monitoring voltage is lower than either the first reference voltage or the second reference voltage.

8. The apparatus of claim 7, wherein the comparator device is further configured to
    after the second reference voltage exceeds the threshold value and before the second reference voltage exceeds the first reference voltage, compare the monitoring voltage to the second reference voltage to output the comparison signal.

9. The apparatus of claim 8, wherein the comparator device is further configured to after the second reference voltage exceeds the first reference voltage, compare the monitoring voltage to the first reference voltage to output the comparison signal.

10. The apparatus of claim 7, wherein the second reference voltage includes a ramp voltage.

11. The apparatus of claim 7, further comprising a level shifter configured to generate the second reference voltage by reducing a level of a voltage for soft starting used in the start-up period of the voltage generator.

12. The apparatus of claim 7, wherein the comparator device comprises a differential amplifier.

13. The apparatus of claim 7, wherein the detecting device comprises a plurality of switches responsive to the comparison signal.

* * * * *